(12) United States Patent
Lim

(10) Patent No.: US 9,180,445 B2
(45) Date of Patent: Nov. 10, 2015

(54) VACUUM PROCESSING APPARATUS HAVING A MEANS FOR PREVENTING COUNTER-PRESSURE BETWEEN CHAMBERS

(71) Applicant: SUNRIN CO., LTD., Hwaseong-si, Gyeonggi-do (KR)

(72) Inventor: Kwang Wook Lim, Osan-si (KR)

(73) Assignee: SUNRIN CO., LTD., Gyeonggi-Do (KR)

( * ) Notice: Subject to any disclaimer, the term of this patent is extended or adjusted under 35 U.S.C. 154(b) by 82 days.

(21) Appl. No.: 14/348,056

(22) PCT Filed: Oct. 5, 2012

(86) PCT No.: PCT/KR2012/008067
§ 371 (c)(1),
(2) Date: Mar. 28, 2014

(87) PCT Pub. No.: WO2013/051877
PCT Pub. Date: Apr. 11, 2013

(65) Prior Publication Data
US 2014/0230930 A1    Aug. 21, 2014

(30) Foreign Application Priority Data

Oct. 5, 2011    (KR) .......................... 10-2011-0101299

(51) Int. Cl.
*F16K 11/20* (2006.01)
*B01L 1/02* (2006.01)
*H01L 21/67* (2006.01)

(52) U.S. Cl.
CPC ............. *B01L 1/02* (2013.01); *H01L 21/67126* (2013.01); *Y10T 137/8634* (2015.04)

(58) Field of Classification Search
CPC ....... F16K 51/02; F01L 21/67126; B01L 1/02
USPC .............. 137/583, 589, 597; 251/26, 29, 158, 251/197, 199, 329; 414/217, 221, 805
See application file for complete search history.

(56) References Cited

U.S. PATENT DOCUMENTS

| | | | |
|---|---|---|---|
| 6,074,202 A | 6/2000 | Yagi et al. | |
| 6,267,545 B1 * | 7/2001 | Mooring et al. | 414/217 |
| 6,843,883 B2 * | 1/2005 | Kosuda et al. | 156/345.32 |
| 9,066,376 B2 * | 6/2015 | Kimrey et al. | 1/1 |
| 2008/0210307 A1 | 9/2008 | Matsumoto et al. | |
| 2011/0033266 A1 * | 2/2011 | Tateshita et al. | 414/217 |
| 2012/0247564 A1 * | 10/2012 | Kho | 137/1 |
| 2013/0004267 A1 * | 1/2013 | Tateshita | 414/217 |

FOREIGN PATENT DOCUMENTS

| | | |
|---|---|---|
| JP | 11-186363 A | 7/1999 |
| JP | 2006-310561 A | 11/2006 |
| KR | 10-2009-0118088 A | 11/2009 |

* cited by examiner

*Primary Examiner* — Craig Schneider
*Assistant Examiner* — Reinaldo Sanchez-Medina
(74) *Attorney, Agent, or Firm* — Revolution IP, PLLC

(57) ABSTRACT

Disclosed is a vacuum processing apparatus having a means for preventing counter-pressure between adjacent chambers, which comprises a process chamber, a transfer chamber, and a load lock chamber, comprising: a cassette chamber installed between the chambers, having slits formed at both opposite side surfaces to serve as a passage of a substrate; a vent detection part configured to detect a vent process in which a vent gas is injected into each chamber; a cassette chamber constant pressure inducing part comprising first and second bypass lines configured to connect each chamber and the cassette chamber and first and second intermittent valves respectively installed at the first and second bypass lines to control a gas flow through each bypass line; and a control part configured to determine whether the vent process or a vacuum process is performed in each chamber through a signal detected from the vent detection part.

3 Claims, 6 Drawing Sheets

VACUUM PROCESSING APPARATUS HAVING A MEANS FOR PREVENTING COUNTER-PRESSURE BETWEEN CHAMBERS

CROSS REFERENCE TO PRIOR APPLICATIONS

This application is a National Stage Application of PCT International Patent Application No. PCT/KR2012/008067 filed on Oct. 5, 2012, under 35 U.S.C. §371, which claims priority to Korean Patent Application No. 10-2011-0101299 filed on Oct. 5, 2011, which are all hereby incorporated by reference in their entirety

TECHNICAL FIELD

The present invention relates to a vacuum processing apparatus including multiple chambers for processing substrates for devices such as an LCD, OLED, and SOLAR, and more particularly, to a vacuum processing apparatus having a means for preventing counter-pressure between adjacent chambers.

BACKGROUND ART

Typically, a process of processing substrates for devices such as an LCD, OLED, and SOLAR needs a sealed chamber for performing a predetermined process under a high vacuum atmosphere, such as a thin film depositing process and an etching process. Further, to increase substrate yield through the chamber, it is important to maintain an inside of the chamber without any contaminants.

The chamber includes a process chamber (PM) in which a predetermined substrate treatment process is performed under a high vacuum condition, a load lock chamber (LM) in which a substrate is loaded or unloaded, and a transfer chamber (TM) which is installed between the PM and the LM to transfer the substrate.

Meanwhile, a slit serving as a passage through which the substrate passes is formed between the chambers, and a slit valve is installed at the slit to open/close the slit.

The slit valve serves to open/close the slit substantially forming the passage between the chambers. The slit valve includes a valve plate having the same shape as that of the slit and a larger size than that of an opening of the slit, an actuator operated by air pressure to drive a shaft connected to the valve plate and thus to lift up and down the valve plate, and the like.

Further, an o-ring 3 for sealing the slit 2 is provided at a portion of the valve plate 1 which is in contact with the slit 2. When the slit 2 is closed using the valve plate 1, the valve plate 1 is pressed to a side of the chamber, and the o-ring 3 is compressed, and thus the slit is sealed.

However, as illustrated in FIG. 1, in a conventional vacuum processing apparatus, since the slit 2 as the substrate passage between the chambers is closed by one valve plate 1, when a vent process in which a gas such as nitrogen is injected to maintain one of the adjacent chambers in an atmospheric pressure state is performed, a pressure difference between the two chambers becomes very large. And the valve plate 1 sealing the slit 2 is pushed from the chamber having high pressure (in which the vent process is performed) toward the chamber having low pressure (which is maintained in the vacuum state).

At this time, when the PM is the chamber having the high pressure (in which the vent process is performed), the valve plate 1 is pushed to the TM by the pressure difference, and also counter-pressure is generated. In this case, a fine gap is generated at a contact surface between the o-ring 3 and the slit 2, and has an influence on a vacuum state of another adjacent chamber. Finally, this causes a defect in the process, and thus leads to a defect in products.

Particularly, since the substrates are recently turned out on a mass production basis, a multi-process chamber type vacuum processing apparatus in which the plurality of process chambers adjacent to the transfer chamber disposed at a center portion of the apparatus are provided and thus the plurality of processes are simultaneously carried out in one apparatus is widely used.

In this case, when one of the plurality of process chambers is in trouble, or the vent process should be performed at the process chambers due to a periodical check, the transfer chamber used as a common chamber should be maintained in the vacuum state, and thus other process chambers may normally perform the process.

However, in the multi-process chamber, when the vent process is performed at one of the process chambers, interleakage occurs between the process chamber in which the vent process is performed and the transfer chamber due to the counter-pressure caused by the pressure difference therebetween, and the vacuum state of the transfer chamber is released, and the vacuum states of other process chambers are also affected, and thus the defect occurs in the entire process.

DISCLOSURE

Technical Problem

The present invention is directed to providing a vacuum processing apparatus having a means for preventing counter-pressure between chambers, which prevents interleakage caused by counter-pressure between a chamber in which a vent process is performed and another adjacent chamber in the vacuum processing apparatus, and thus may reduce process defects.

Technical Solution

One aspect of the present invention provides a vacuum processing apparatus having a means for preventing counter-pressure between adjacent chambers, which includes a process chamber, a transfer chamber, and a load lock chamber, including a cassette chamber installed between the chambers, having slits formed at both opposite side surfaces to serve as a passage of a substrate, and providing a space for receiving slit valves having first and second valve plates moved up and down to open and close the slits, a vent detection part configured to detect a vent process in which a vent gas is injected into each chamber, a cassette chamber constant pressure inducing part comprising first and second bypass lines configured to connect each chamber and the cassette chamber and first and second intermittent valves respectively installed at the first and second bypass lines to control a gas flow through each bypass line, such that the gas injected into each chamber is bypassed into the cassette chamber while the both slits of the cassette chamber are sealed by the first and second valve plates and thus a constant pressure is induced between the chamber in which the vent process is performed and the cassette chamber, and a control part configured to determine whether the vent process or a vacuum process is performed in each chamber through a signal detected from the vent detection part.

The vacuum processing apparatus may further include a vent valve connected to each chamber to inject the vent gas into each chamber, and the vent detection part may be a vent valve detecting sensor installed at a side of the vent valve to detect an electric signal for opening and closing the vent valve.

The slit valve may further include a connection member configured to connect the first and second valve plates so that the first and second valve plates are simultaneously driven by one driving means.

Advantageous Effects

When a vent process is performed in one chamber, the cassette chamber in accordance with the present invention is provided between the chamber (a vent chamber) in which the vent process is performed and another adjacent chamber (a vacuum chamber), so that the cassette chamber providing the space for a lifting operation of the slit valve is constantly maintained in the atmospheric pressure, and also in the cassette chamber and the vacuum chamber, the valve plate sealing the vacuum chamber in the cassette chamber is pressed and in close contact with the side of the vacuum chamber by the pressure difference between the atmospheric pressure and the vacuum pressure, and thus sealing force of the o-ring is further enhanced, and the occurrence of interleakage due to the counter pressure between the vent chamber and the vacuum chamber is completely prevented.

MODES OF THE INVENTION

Figure 1:
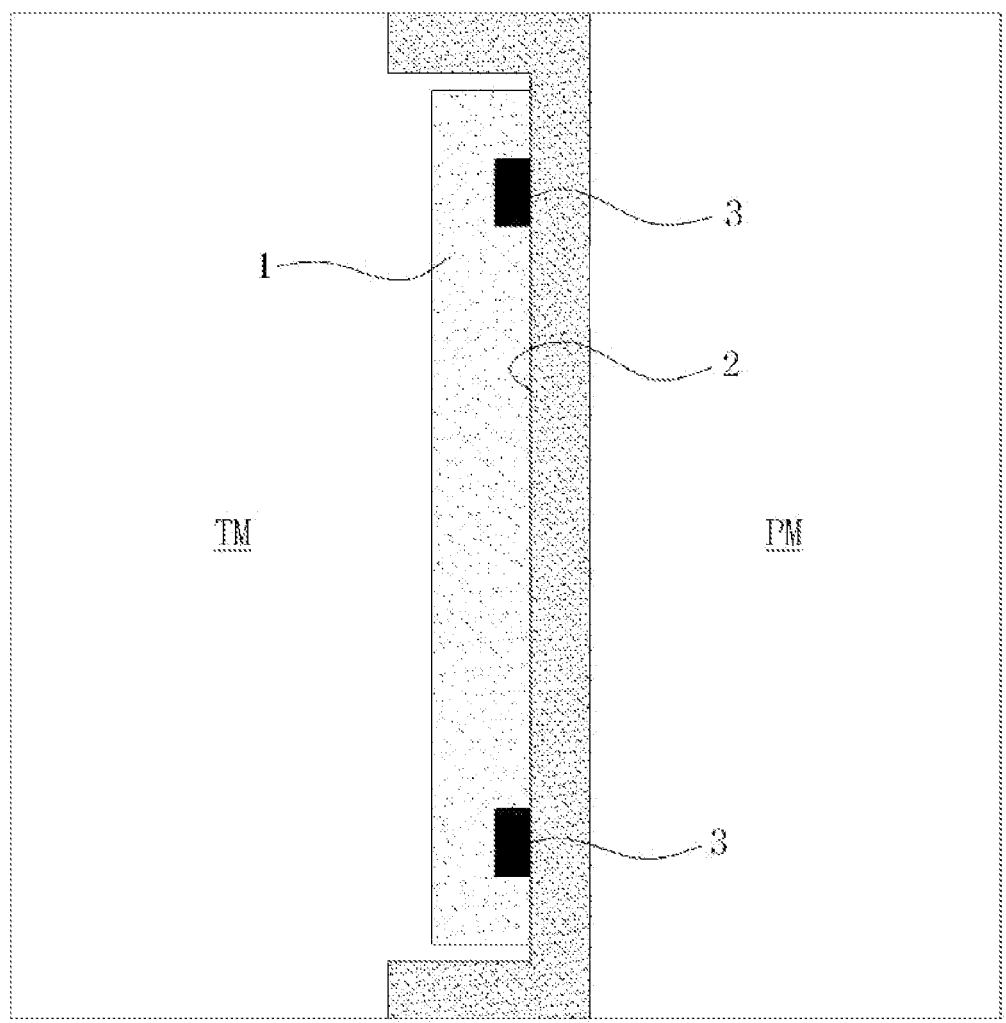
FIG. 1 is a conceptual view illustrating a slit valve between a transfer chamber and a process chamber in a conventional vacuum processing apparatus.

Hereinafter, exemplary embodiments of the present invention will be described in detail.

The description of a process chamber (PM), a load lock chamber (LM), a transfer chamber (TM), and a cassette chamber of the present invention, which will be described below, uses abbreviations mixed with reference numerals designated in the drawings. However, this is just for convenience of explanation, and they substantially designate the same configurations.

Figure 2:
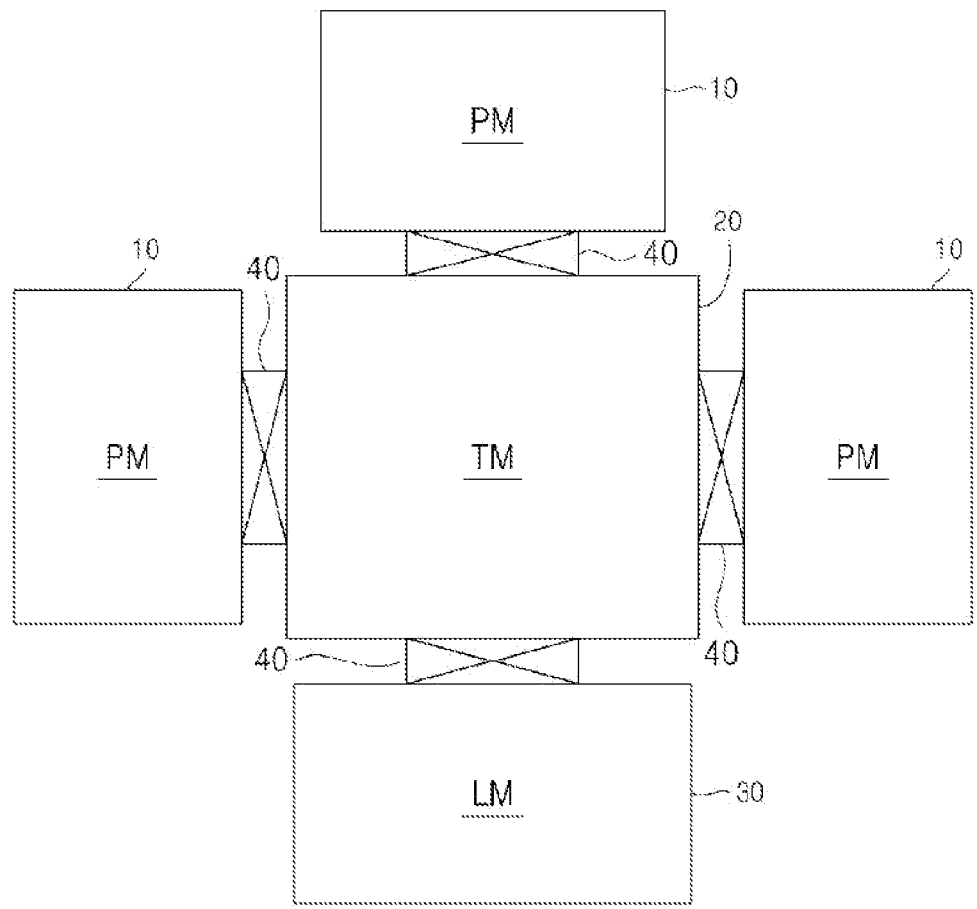
FIG. 2 is a plan view illustrating a multi-type chamber to which a vacuum processing apparatus having a means for preventing counter-pressure between chambers of the present invention is applied.

FIG. 2 is a plan view illustrating a multi-process chamber type vacuum processing apparatus having a means for preventing counter-pressure between chambers of the present invention.

As illustrated in FIG. 2, in the vacuum processing apparatus of the present invention, a load lock chamber 30 is provided at one side of a transfer chamber 20 which is typically disposed at a center portion thereof to be commonly used, and a plurality of process chambers 10 configured to perform a substrate processing process are disposed at the other side of the transfer chamber 20 to be parallelly connected with each other.

Further, a cassette chamber 40 which provides a space for an operation of a slit valve configured to open and close a slit serving as a substrate passage between the chambers is provided between the chambers.

In the present invention, when a vent process is performed at one of the chambers adjacent to the cassette chamber 40 and a vacuum process is performed at another chamber, a cassette chamber constant pressure inducing part configured to adapt the cassette chamber 40 to be under the same pressure state as that of the chamber in which the vent process is performed, i.e., to be maintained in a constant pressure state is provided to prevent generation of interleakage due to a pressure difference between the chamber in which the vent process is performed and the chamber in which the vacuum process is performed.

Figure 3:
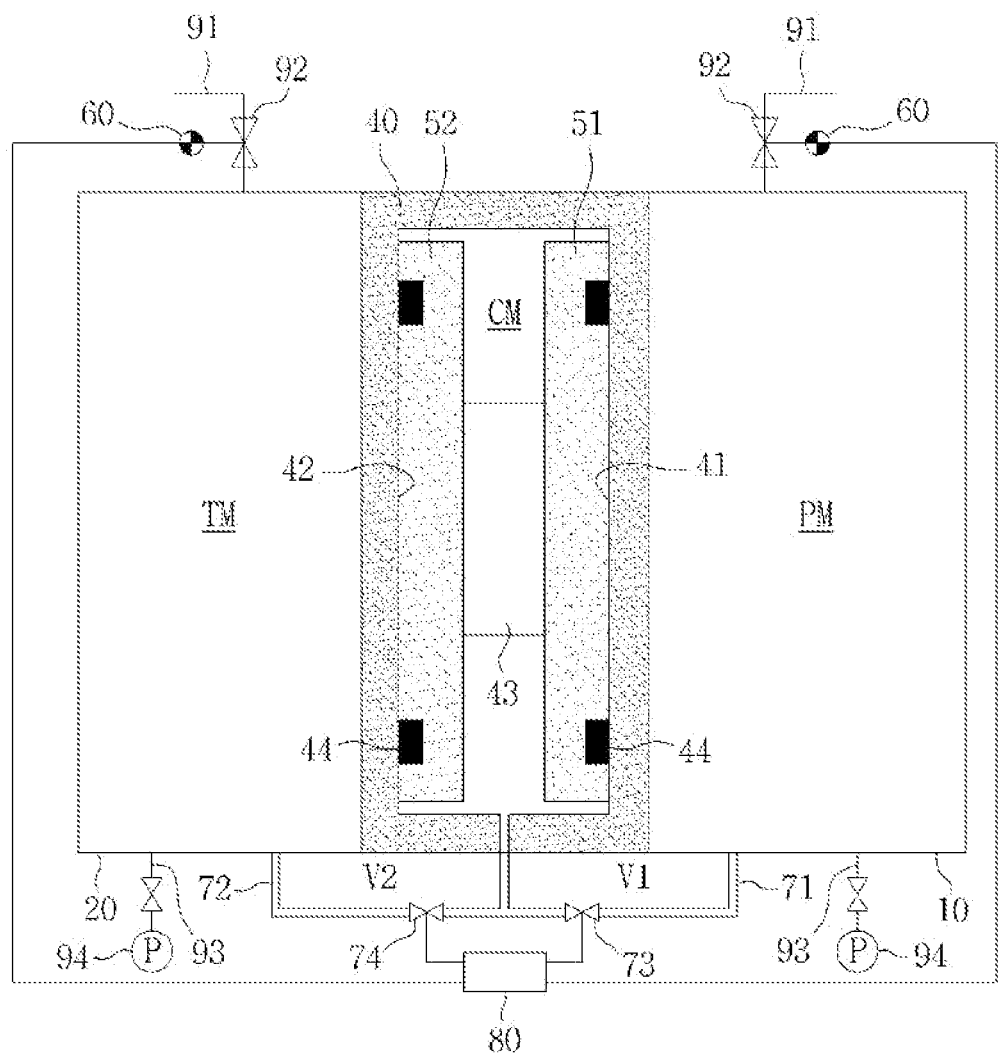
FIG. 3 is a conceptual view illustrating a cassette chamber constant pressure inducing part between a process chamber and a transfer chamber in the vacuum processing apparatus of the present invention.

In this regard, FIG. 3 is a conceptual view illustrating the cassette chamber constant pressure inducing part forming a subject matter of the present invention.

In FIG. 3, the cassette chamber constant pressure inducing part is provided between the process chamber and the transfer chamber. However, the present invention is not limited to the cassette chamber constant pressure inducing part provided at the cassette chamber between the process chamber and the transfer chamber. The cassette chamber constant pressure inducing part may be also applied to the cassette chamber between the load lock chamber and the transfer chamber.

As illustrated in FIG. 3, the vacuum processing apparatus having a means for preventing counter-pressure between adjacent chambers according to the present invention includes the cassette chamber 40 configured to partition between the adjacent chambers, for example, the transfer chamber 20 and the process chamber 10 and also provide the space for up and down movement of the slit valve which opens and closes the substrate passage, the cassette chamber constant pressure inducing part configured to adapt the cassette chamber 40 and one of the transfer chamber 20 and the process chamber 10, in which the vent process is performed, to be under the constant pressure, a vent detection part 60 configured to detect the vent process of each chamber 10, 20, and a control part 80 configured to receive an electric signal from the vent detection part 60 and control an operation of the cassette chamber constant pressure inducing part.

The cassette chamber 40 is configured as an empty case having a rectangular parallelepiped shape and installed between the transfer chamber 20 and the process chamber 10, and slits 41 and 42 serving as the substrate passage are respectively formed in opposite side surfaces of the cassette chamber 40.

The slit valve which is moved up and down by air pressure to open and close each slit 41, 42 is installed in the cassette chamber 40.

At this time, the slit valve includes first and second valve plates 51 and 52 which are vertically disposed to be opposite to each other and thus to open and close each slit 41, 42 provided at both side surfaces of the cassette chamber 40 and integrally connected with each other through a connection member 43, and a pneumatic cylinder type actuator (not shown) having a shaft (not shown) coupled to a center of the connection member 43. The slit valve is operated in a dual sealing manner in which the first and second valve plates 51 and 52 connected to each other through the connection member 43 are simultaneously moved up and down according to up and down movement of the shaft by driving of the actuator.

An o-ring 44 is provided at each portion of the first and second valve plates 51 and 52, which is in contact with each slit 41, 42, to seal the slits 41 and 42 provided at both side surfaces of the cassette chamber 40.

The cassette chamber constant pressure inducing part includes a first bypass line 71 configured to connect the process chamber 10 and the cassette chamber 40 so that a gas may flow between the process chamber 10 and the cassette chamber 40, a second bypass line 72 configured to connect the transfer chamber 20 and the cassette chamber 40 so that a gas may flow between the transfer chamber 20 and the cassette chamber 40, and first and second intermittent valves 73 and 74 which are respectively installed on the first and second bypass lines 71 and 72 to control a gas flow through each bypass line 71, 72 by a control signal of the control part 80 to be described later.

Meanwhile, a vacuum pump 94 is installed at a vacuum line 93 connected at one side of each chamber 10, 20 to form a vacuum state during a process, and a valve configured to open and close the vacuum line 93 is installed at a front end of the vacuum pump 94.

Further, a vent line 91 through which a vent gas is injected into the chamber to convert an inside of the chamber into an atmospheric pressure state is provided at the other side of each chamber 10, 20. A vent valve 92 which has only an opening/closing function for controlling introduction of the vent gas into each chamber 10, 20 is installed at the vent line 91.

Here, nitrogen ($N_2$) having low reactivity is generally used for the vent gas.

Meanwhile, in the present invention, the vent detection part 60 configured to detect whether the vent process is performed at each chamber 10, 20 upon the vent process of the process chamber 10 and the transfer chamber 20 is provided.

At this time, the vent detection part 60 is a sensor which is installed at a side of the vent valve 92 of each chamber 10, 20 to detect an electric signal for opening and closing the vent valve 92.

The control part 80 is electrically connected with the vent detection part 60 provided at each chamber 10, 20 and the first and second intermittent valves 73 and 74.

Figure 4:
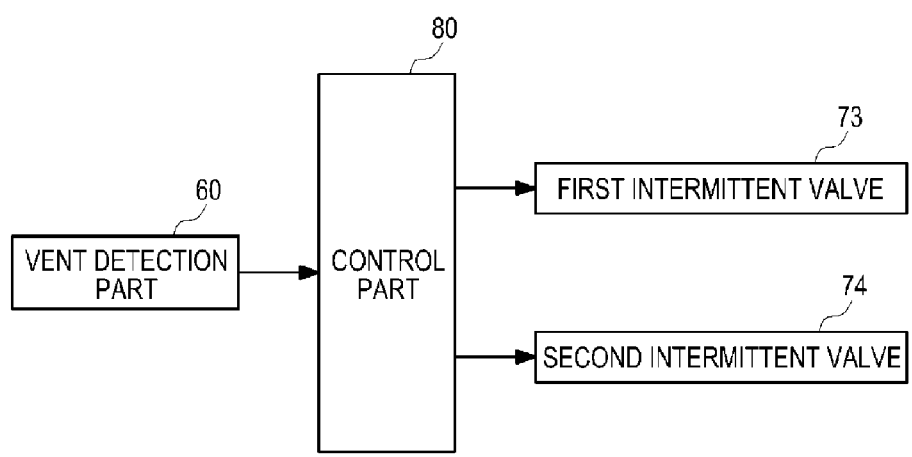
FIG. 4 is a control block diagram illustrating a control flow in the vacuum processing apparatus of the present invention by a control part.

In this connection, FIG. 4 is a control block diagram for operating the cassette chamber constant pressure inducing part according to one embodiment of the present invention.

As illustrated in FIG. 4, when the control part 80 receives a signal informing a state in which the vent valve 92 is opened from the vent detection part 60, the control part 80 determines that the chamber having the vent valve 92 is under the vent process, and thus controls the intermittent valve 73 or 74 installed at the bypass line 71 or 72 connected to the corresponding chamber and the cassette chamber to be opened. On the contrary, when the control part 80 receives a signal informing a state in which the vent valve 92 is closed from the vent detection part 60, the control part 80 determines that the chamber having the vent valve 92 is under the vacuum process, and thus controls the intermittent valve 73 or 74 installed at the bypass line 71 or 72 connected to the corresponding chamber and the cassette chamber to be closed.

Hereinafter, an operation of preventing the counter-pressure between one chamber, in which the vent process is performed, and another adjacent chamber in the above-mentioned vacuum processing apparatus according to the present invention will be described.

Figure 5:
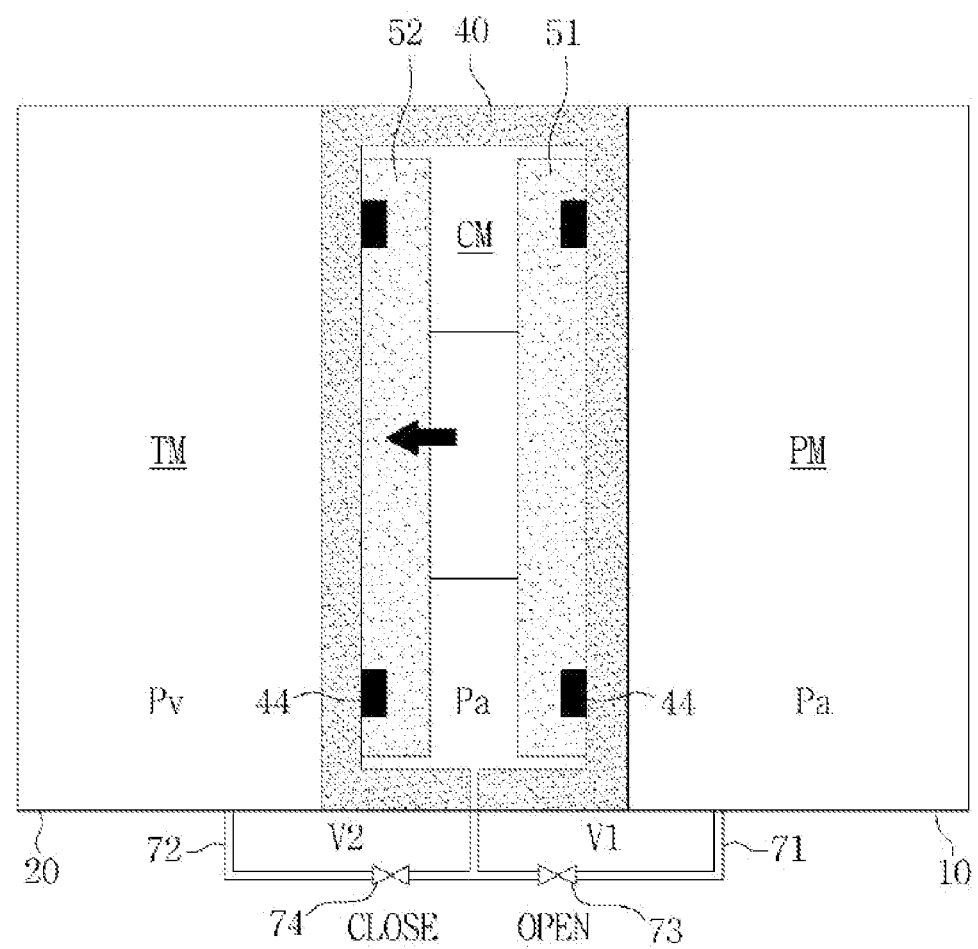
FIG. 5 is a conceptual view illustrating a constant pressure state between the cassette chamber and the transfer chamber in a state in which the process chamber is under a vent process in the vacuum processing apparatus of the present invention.
Figure 6:
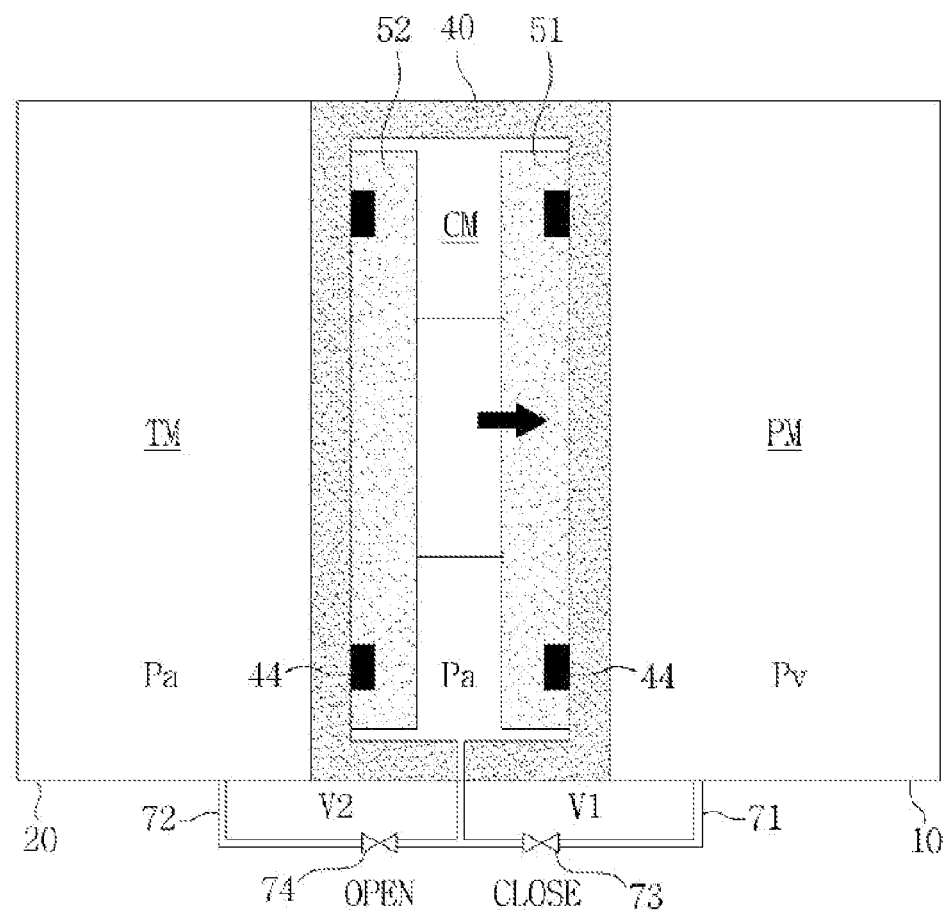
FIG. 6 is a conceptual view illustrating a constant pressure state between the cassette chamber and the process chamber in a state in which the transfer chamber is under a vent process in the vacuum processing apparatus of the present invention.

FIG. 5 is a conceptual view illustrating an operation of inducing the constant pressure between the cassette chamber (CM) and the transfer chamber (TM) when the process chamber (PM) performs the vent process and the transfer chamber (TM) performs the vacuum process, and FIG. 6 is a conceptual view illustrating an operation of inducing the constant pressure between the cassette chamber (CM) and the process chamber (PM) when the transfer chamber (TM) performs the vent process and the process chamber (PM) performs the vacuum process.

Referring to FIG. 5, a state in which the process chamber (PM) performs the vent process will be described. In the multi-type chamber having the plurality of process chambers (PM), when one of the processes of other process chambers is in trouble, or it is necessary to maintain the process chamber (PM) in the atmospheric pressure state due to a periodical check, the vent process in which a nitrogen gas is injected into the process chamber (PM) is performed.

At this time, to inject the nitrogen gas from an outside into the process chamber 10, the vent valve 92 disposed at a side of the process chamber 10 is in an open state. The vent valve 92 disposed at a side of the transfer chamber 20 is in a closed state so that the transfer chamber 20 is maintained in the vacuum state and thus operations of the processes with another process chamber may be continuously performed (referring to FIG. 3).

The vent detection part 60 connected to a side of the vent valve 92 of each chamber 10, 20 detects the open or closed state of the vent valve 92 of each chamber 10, 20 and transfers the corresponding electric signal to the control part 80 (referring FIG. 4).

The control part 80 determines that the process chamber 10 performs the vent process and the transfer chamber 20 performs the vacuum process through the signal from the vent detection part 60 of each chamber 10, 20, and thus controls the first intermittent valve 73 installed at the first bypass line 71 connected to the process chamber 10 and the cassette chamber 40 to be opened, and controls the second intermittent valve 74 installed at the second bypass line 72 connected to the transfer chamber 20 and the cassette chamber 40 to be closed.

Therefore, the vent gas introduced into the process chamber 10 is introduced into the cassette chamber 40 through the first bypass line 71, and the process chamber 10 and the cassette chamber 40 may be constantly maintained in the same atmospheric pressure Pa. Meanwhile, since the second bypass line 72 is closed and thus the introduction of the vent gas from the cassette chamber 40 to the transfer chamber 20 is blocked, the cassette chamber 40 and the transfer chamber 20 may be continuously maintained in a pressure Pv of the vacuum state.

At this time, in the cassette chamber 40 and the transfer chamber 20, the second valve plate 52 sealing the slit formed at the side of the transfer chamber 20 is pressed and in close contact with the side of the transfer chamber 20 by the pressure difference between the atmospheric pressure Pa and the vacuum pressure Pv, and thus sealing force of the o-ring 44 is further enhanced, and the interleakage due to the pressure difference does not occur at all.

In a case in which, after the vent process in the process chamber 10 is completed, the process chamber 10 is maintained again in the vacuum state and the process is continuously performed, the vacuum pump 94 (FIG. 3) installed at the process chamber 10 is operated, while the first intermittent valve 73 is opened and the second intermittent valve 74 is closed, and thus the process chamber 10 and the cassette chamber 40 may form the vacuum state.

Then, upon an initial operation of the valve after the process chamber 10 and the cassette chamber 40 completely forms the vacuum state, the control part 80 controls the first intermittent valve 73 to be closed and the also controls the second intermittent valve 74 to be opened, and thus the subsequent process is performed.

For reference, during the process of the process chamber 10, the second intermittent valve 74 is always maintained in the open state.

Referring to FIG. 6, the venting process of the transfer chamber (TM) will be described. In the transfer chamber (TM), when an inside of the transfer chamber (TM) is in trouble during the process, for example, a transfer robot has a problem, the transfer chamber (TM) should be maintained in the atmospheric pressure to repair and check the transfer robot, and thus the vent process in which the nitrogen gas is injected into the transfer chamber (TM) is performed.

In this case, when the vent valve 92 disposed at the side of the transfer chamber is opened to inject the nitrogen gas into the transfer chamber 20, the other process chambers 10 continuously perform the vacuum process to maintain the vacuum state and thus prevent contamination. At this time, the vent valve 92 disposed at the side of the process chamber 10 is in the closed state (referring to FIG. 3).

The control part 80 determines that the transfer chamber 20 performs the vent process and the other process chambers 10 perform the vacuum process through the signal of the vent detection part 60 of each chamber 10, 20, and thus controls the first intermittent valve 73 installed at the first bypass line 71 connected to the process chamber 10 and the cassette chamber 40 to be closed, and controls the second intermittent valve 74 installed at the second bypass line 72 connected to the transfer chamber 20 and the cassette chamber 40 to be opened.

Therefore, the vent gas introduced into the transfer chamber 20 is introduced into the cassette chamber 40 through the second bypass line 72, and the transfer chamber 20 and the cassette chamber 40 may be constantly maintained in the same atmospheric pressure Pa. Meanwhile, since the first intermittent valve 73 of the first bypass line 71 is closed and thus the introduction of the vent gas from the cassette chamber 40 to the process chamber 10 is blocked, the process chamber 10 may be continuously maintained in a pressure Pv of the vacuum state.

At this time, in the cassette chamber 40 and the process chamber 10, the first valve plate 51 sealing the slit formed at the side of the process chamber 10 is pressed and in close contact with the side of the process chamber 10 by the pressure difference between the atmospheric pressure Pa and the vacuum pressure Pv, and thus sealing force of the o-ring 44 is further enhanced, and the interleakage due to the pressure difference does not occur at all.

In a case in which, after the vent process in the transfer chamber 20 is completed, the transfer chamber 20 is maintained again in the vacuum state and the process is continuously performed, the vacuum pump 94 (FIG. 3) installed at the transfer chamber 20 is operated, while the first intermittent valve 73 is closed and the second intermittent valve 74 is opened, and thus the transfer chamber 20 and the cassette chamber 40 may form the vacuum state.

Then, when the transfer chamber 20 and the cassette chamber 40 completely forms the vacuum state, the first intermittent valve 73 is maintained in the closed state and the second intermittent valve 74 is maintained in the open state, and thus the subsequent process is performed.

As described above, in the vacuum processing apparatus having the means for preventing counter-pressure between adjacent chambers, when the process chamber (PM) performs the vent process, the cassette chamber (CM) is also in the vent process (atmospheric state). And when the transfer chamber (TM) performs the vent process, the cassette chamber (CM) is also in the vent process (atmospheric state). That is, when the vent process is performed in the process chamber (PM) or the transfer chamber (TM), the cassette chamber (CM) serves as a buffer area which is in the vent state (atmospheric state), while each valve plate of the slit valve seals the slits of both chambers (TM) (PM), and thus the interleakage due to the counter-pressure caused by the pressure difference between the both chambers does not occur between the chambers.

Meanwhile, in case of the load lock chamber (RM), when the substrate is introduced from the outside, or the finished substrate is discharged to the outside, the vent process is performed. At this time, the configuration and the method of maintaining the constant pressure in the cassette chamber (CM) between the load lock chamber (RM) and the transfer chamber (TM) may be the same as those of maintaining the constant pressure in the cassette chamber (CM) between the transfer chamber and the process chamber.

In this specification, exemplary embodiments of the present invention have been classified into the first, second, and third exemplary embodiments and described for conciseness. However, respective steps or functions of an exemplary embodiment may be combined with those of another exemplary embodiment to implement still another exemplary embodiment of the present invention.

The invention claimed is:

1. A vacuum processing apparatus having a means for preventing counter-pressure between adjacent chambers, which comprises a process chamber, a transfer chamber, and a load lock chamber, comprising:
    a cassette chamber installed between the chambers, having slits formed at both opposite side surfaces to serve as a passage of a substrate, and providing a space for receiving slit valves having first and second valve plates moved up and down to open and close the slits;
    a vent detection part configured to detect a vent process in which a vent gas is injected into each chamber;
    a cassette chamber constant pressure inducing part comprising first and second bypass lines configured to connect each chamber and the cassette chamber and first and second intermittent valves respectively installed at the first and second bypass lines to control a gas flow through each bypass line, such that the gas injected into each chamber is bypassed into the cassette chamber while the both slits of the cassette chamber are sealed by the first and second valve plates and thus a constant pressure is induced between the chamber in which the vent process is performed and the cassette chamber; and
    a control part configured to determine whether the vent process or a vacuum process is performed in each chamber through a signal detected from the vent detection part.

2. The vacuum processing apparatus of claim 1, further comprising a vent valve connected to each chamber to inject the vent gas into each chamber,
    wherein the vent detection part is a vent valve detecting sensor installed at a side of the vent valve to detect an electric signal for opening and closing the vent valve.

3. The vacuum processing apparatus of claim 1, wherein the slit valve further comprises a connection member configured to connect the first and second valve plates so that the first and second valve plates are simultaneously driven by one driving means.

* * * * *